(12) United States Patent
Hovmoller

(10) Patent No.: US 10,199,077 B2
(45) Date of Patent: Feb. 5, 2019

(54) MEMORY ARRANGEMENT

(71) Applicant: Axis AB, Lund (SE)

(72) Inventor: Henrik Hovmoller, Lund (SE)

(73) Assignee: Axis AB, Lund (SE)

(*) Notice: Subject to any disclaimer, the term of this patent is extended or adjusted under 35 U.S.C. 154(b) by 0 days.

(21) Appl. No.: 15/823,932

(22) Filed: Nov. 28, 2017

(65) Prior Publication Data

US 2018/0158490 A1    Jun. 7, 2018

(30) Foreign Application Priority Data

Dec. 6, 2016 (EP) .................................. 16202348

(51) Int. Cl.

| G11C 5/02 | (2006.01) |
|---|---|
| H01L 27/02 | (2006.01) |
| G11C 8/06 | (2006.01) |
| G11C 5/06 | (2006.01) |
| G11C 5/04 | (2006.01) |
| G11C 8/12 | (2006.01) |
| H05K 1/02 | (2006.01) |

(52) U.S. Cl.
CPC .............. G11C 5/025 (2013.01); G11C 5/04 (2013.01); G11C 5/06 (2013.01); G11C 8/06 (2013.01); G11C 8/12 (2013.01); H01L 27/0207 (2013.01); H05K 1/0243 (2013.01); *H05K 2201/09327* (2013.01); *H05K 2201/10159* (2013.01); *H05K 2201/10545* (2013.01)

(58) Field of Classification Search
CPC ............ G11C 11/406; G11C 11/40615; G11C 2211/4061; G11C 11/40618; G11C 2211/4067

USPC ...................................................... 365/51, 63
See application file for complete search history.

(56) References Cited

U.S. PATENT DOCUMENTS

| 4,891,789 A | 1/1990 | Quattrini et al. |
|---|---|---|
| 5,260,892 A | 11/1993 | Testa |
| 8,924,639 B2 | 12/2014 | Ahn et al. |
| 9,432,298 B1 | 8/2016 | Smith |
| 9,449,650 B2 * | 9/2016 | Seok ........................ G11C 5/04 |

(Continued)

FOREIGN PATENT DOCUMENTS

EP     0 335 123 A2     10/1989

OTHER PUBLICATIONS

Extended European Search Report dated Sep. 15, 2017 in European application 16202348.5, filed on Dec. 6, 2016 ( with Written Opinion).

*Primary Examiner* — Son Dinh
(74) *Attorney, Agent, or Firm* — Oblon, McClelland, Maier & Neustadt, L.L.P.

(57) ABSTRACT

A memory arrangement and method to arrange memories are disclosed. The memory arrangement comprises at least two memory chips (M1, M2) arranged on a Printed Circuit Board, PCB. A first memory chip (M1) is arranged on a first surface of the PCB, a second memory chip (M2) is arranged on a second surface of the PCB. The second memory chip (M2) is placed back to back to the first memory chip (M1) and oriented such that respective pins having the same function on the first memory chip (M1) and the second memory chip (M2) are placed opposite to each other and connected by vias to respective signal traces arranged between the first and second surfaces of the PCB.

11 Claims, 7 Drawing Sheets

(56) References Cited

U.S. PATENT DOCUMENTS

| | | | |
|---|---|---|---|
| 2004/0176938 A1* | 9/2004 | Gisin | G06F 17/5036 703/14 |
| 2005/0097249 A1 | 5/2005 | Oberlin et al. | |
| 2008/0101050 A1 | 5/2008 | Fung | |
| 2011/0145504 A1 | 6/2011 | Anh et al. | |
| 2014/0192583 A1 | 7/2014 | Rajan et al. | |
| 2014/0301125 A1 | 10/2014 | Yoon et al. | |

* cited by examiner

MEMORY ARRANGEMENT

TECHNICAL FIELD

Embodiments herein relate to a memory arrangement arranged on a Printed Circuit Board, PCB. Further they relate to an electronic device comprising the memory arrangement.

BACKGROUND

When designing a PCB, one problem is how to route all connecting lines, and one particular problem arises when connecting a Central Processing Unit (CPU) to a memory chip. The memory chip is generally symmetric and has a plurality of pins. Each pin of the memory chip has to be connected to the CPU. Due to timing requirements, the connecting lines group wise or pairwise have to have identical length, and this is often done by using a T-branch topology. FIG. 1 shows PCB layout examples for a symmetrical and an asymmetrical T-branch topology. One disadvantage with the T-branch topology is that additional stubs and stubs length increase command and address line run lengths as well as data and strobe bus lengths. This will inhibit the speed at which signals are effectively transferred. More specifically, as address lines and data buses lengthen, transmission line effects increase which limits effective signal speeds. Furthermore, when more and more memory chips are used, and with many pins on each memory chip, it is a challenge to fit all connecting lines in a limited area of the PCB.

In U.S. Pat. No. 5,260,892, a method for doubling the density of Random Access Memory (RAM) chips without significantly increasing the signal trace length is demonstrated. As shown in FIG. 2 of the present disclosure, a RAM chip 65 is mounted to a double sided circuit board 66 with a mirror image RAM chip 67 mounted on the other side. The RAM chip 65 is identical to the mirror image RAM chip 67 except that the leads of the RAM chip are mirror images of the leads of the mirror image RAM chip. That is to say, in this example, looking from the top of the chips, the front left pin 68 of the RAM chip 65 serves the same electrical function as the front right pin 69 of the mirror image RAM chip 67. The RAM chip 65 and its mirror image RAM chip 67 are mounted opposite each other on the circuit board 66 in such a manner that the front left pin 68 of the RAM chip 65 is connected electrically to the front right pin 69 of the mirror image RAM chip 67 through the circuit board 66 by a via 70 which is also connected electrically to a signal trace 71 which serves both pins. Similarly, the second pin from the front 72 on the left side of the RAM chip 65 corresponds to the second pin from the front 73 on the right side of the mirror image RAM chip 67, etc.

However the trace 71 is on one side of the PCB, so there will be a difference in length of the total trace for RAM chip 65 and RAM chip 67, namely the length of the via. For a PCB with thickness of, e.g., 1.6 mm, this is quite a large difference. Such a thickness may correspond to a timing difference of 8-9 picoseconds, which should be compared to an accuracy of about 3 picoseconds required in many specifications. Further, the two RAM chips are still two separate chips. Moreover, there are still no such mirrored memory chips on the current market so that they could be used directly in pairs with one memory chip on each side of the PCB.

SUMMARY

In light of the above it is an object of embodiments herein to provide an improved method and arrangement for arranging and connecting memory chips on the PCB.

According to one aspect of embodiments herein, the object is achieved by a memory arrangement comprising at least two memory chips arranged on a Printed Circuit Board, PCB. A first memory chip is arranged on a first surface of the PCB. A second memory chip is arranged on a second surface of the PCB. The second memory chip is placed back to back to the first memory chip and oriented such that respective pins having same function on the first memory chip and the second memory chip are placed opposite to each other and connected by vias to respective signal traces arranged between the first and second surfaces of the PCB.

According to one aspect of embodiments herein, the object is achieved by a method for arranging memory chips on a Printed Circuit Board, PCB. The method comprising arranging a first memory chip on a first surface of the PCB, arranging a second memory chip on a second surface of the PCB back to back to the first memory chip, and orienting the second memory chip such that respective pins having same function on the first and the second memory chips are placed opposite to each other and connected by vias to respective signal traces arranged between the first and second surfaces of the PCB.

In other words, two memory chips are arranged back to back on the opposite surfaces of the PCB. The second memory chip is oriented such that respective pins having same function, such as command pin, address pin, data pin, clock pin, power pin, ground pin etc., on the first memory chip and the second memory chip are placed opposite to each other, and therefore each pair of pins that have the same function on the first and second memory chips can be connected together by one single via, and then connected to the respective signal traces placed between the two opposite surfaces of the PCB, such as command line, address line, data bus, clock bus, power supply plane, ground plane etc. Such an arrangement is based on an idea of creating one virtual memory package derived from two physical memory packages. Thus, the memory arrangement is no longer limited by the physical packages. One half of each of the two physical memory chips together may form one memory unit. In this way, the second memory chip can be seen as mirror symmetric to the first memory chip. As a result of the symmetry and being placed back to back on the two surfaces of the PCB, the T-branches for connecting two memory chips to a CPU are reduced to vias. Therefore the layout for connecting lines takes up less space and has a less complex topology, effectively eliminating the T-branches. Further there is no difference in the total length of the signal traces for the two memory chips.

With this solution, the signal integrity performance is superior, the area requirement on the PCB is smaller, and manufacturing is less expensive because of the less complex topology.

According to other aspects of embodiments herein, the object is achieved by an electronic device which comprises a memory arrangement according to embodiments herein.

BRIEF DESCRIPTION OF THE DRAWINGS

Examples of embodiments will be described in more detail with reference to attached drawings in which.

DETAILED DESCRIPTION

Figure 1:
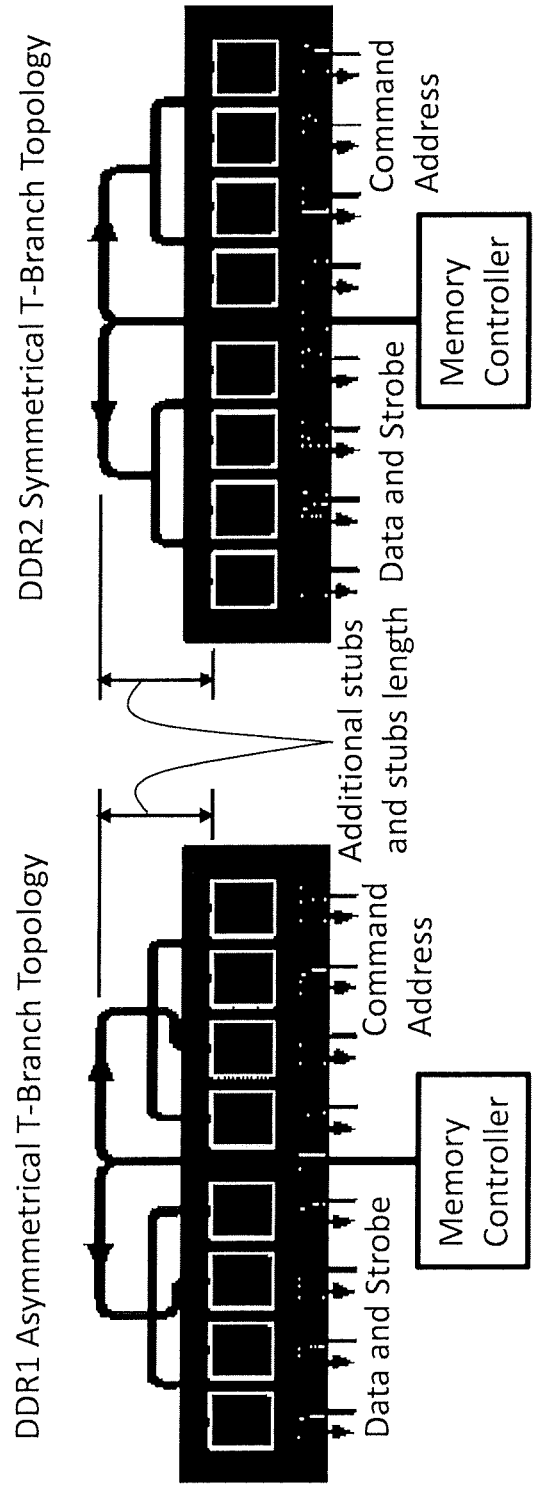
FIG. 1 is a schematic layout view showing T-branch topology according to prior art.
Figure 2:
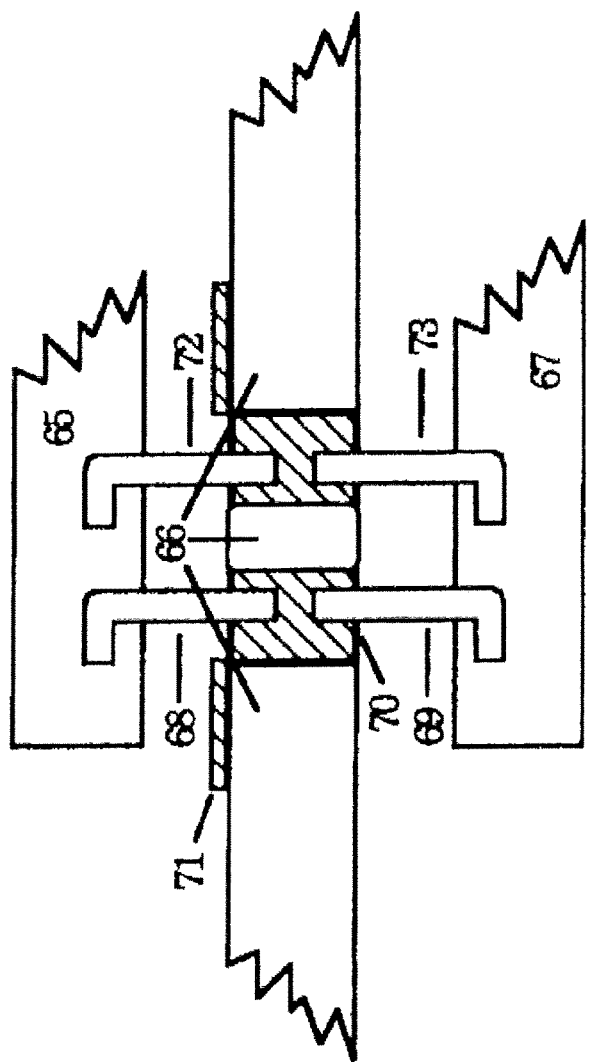
FIG. 2 is a side cut schematic view illustrating a PCB with two memory chips according to prior art.
Figure 3:
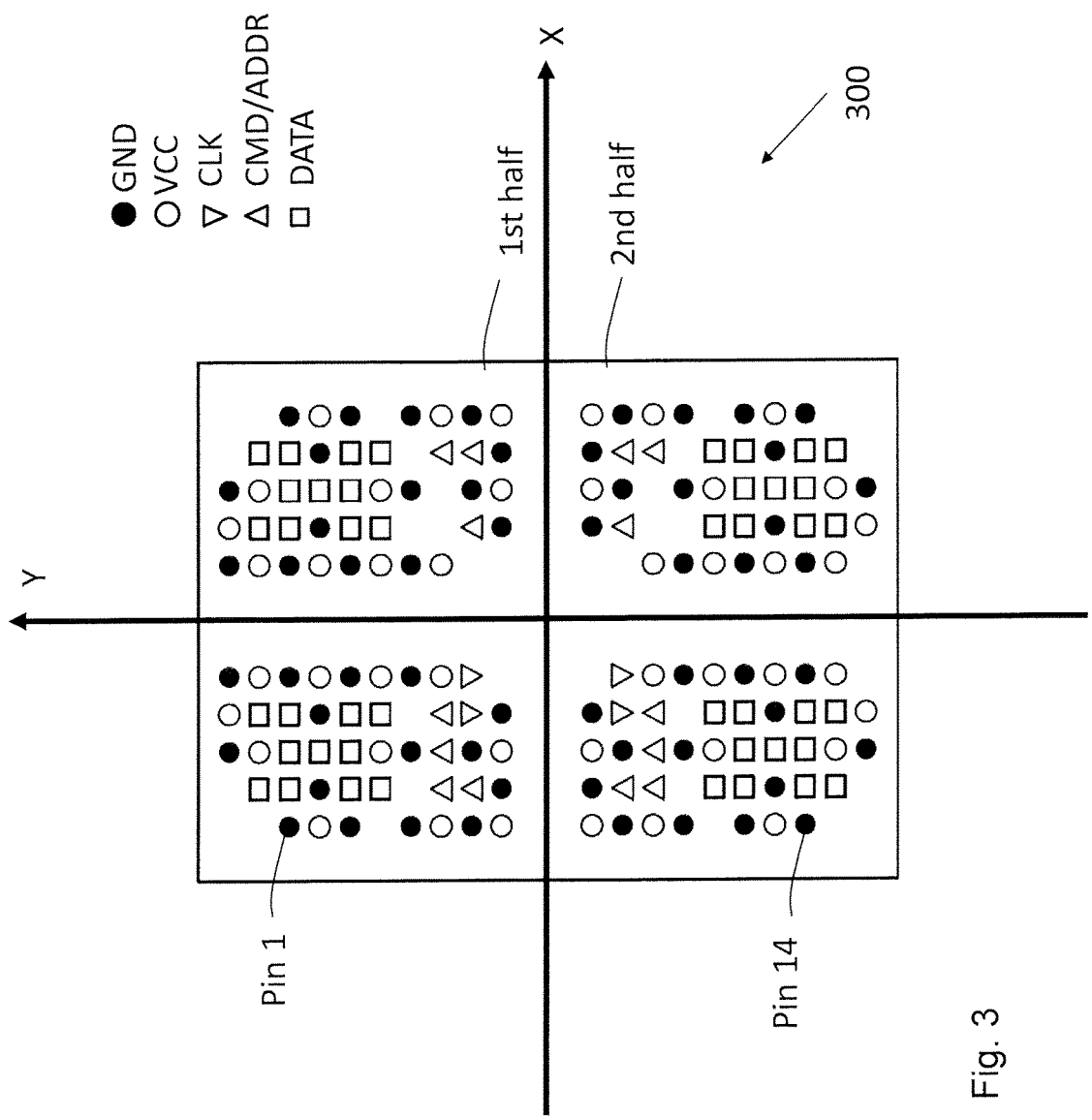
FIG. 3 is a schematic top view illustrating an example of a memory chip with pin functions.

FIG. 3 is a schematic top view of a memory chip 300, where a memory chip with a plurality of pins is shown. Different pins are illustrated with different shapes or symbols to show their functions. For example, pins with ground function GND which will be connected to ground plane are shown by a filled circle symbol, pins with power function VCC which will be connected to power supply plane are shown by a circle symbol, pins with data function DATA which will be connected to data bus are shown by a square symbol, pins with clock function CLK which will be connected to clock bus are shown by an upside-down triangle symbol, pins with command and address functions CMD/ADDR, which will be connected to command/address lines are shown by a triangle symbol. The memory chip 300 may be any symmetric memory chip, e.g. a Low Power Double Data Rate (LPDDR) 4 memory chip. The memory chip 300 is symmetrical about a center axis, e.g. an X-axis or Y-axis as shown in FIG. 3. This means that the memory chip 300 may be virtually divided along either the vertical axis Y or the horizontal axis X to a first half and a second half. The first half and second half are mirror symmetric to each other with regards to pins function. In the example shown in FIG. 3, the first half and second half divided along the X-axis are mirror symmetric to each other with regards to pins function. Further, looking from the top of the chip 300, the upper left pin is denoted as Pin 1 and the lower left pin is denoted as Pin 14.

Figure 4:
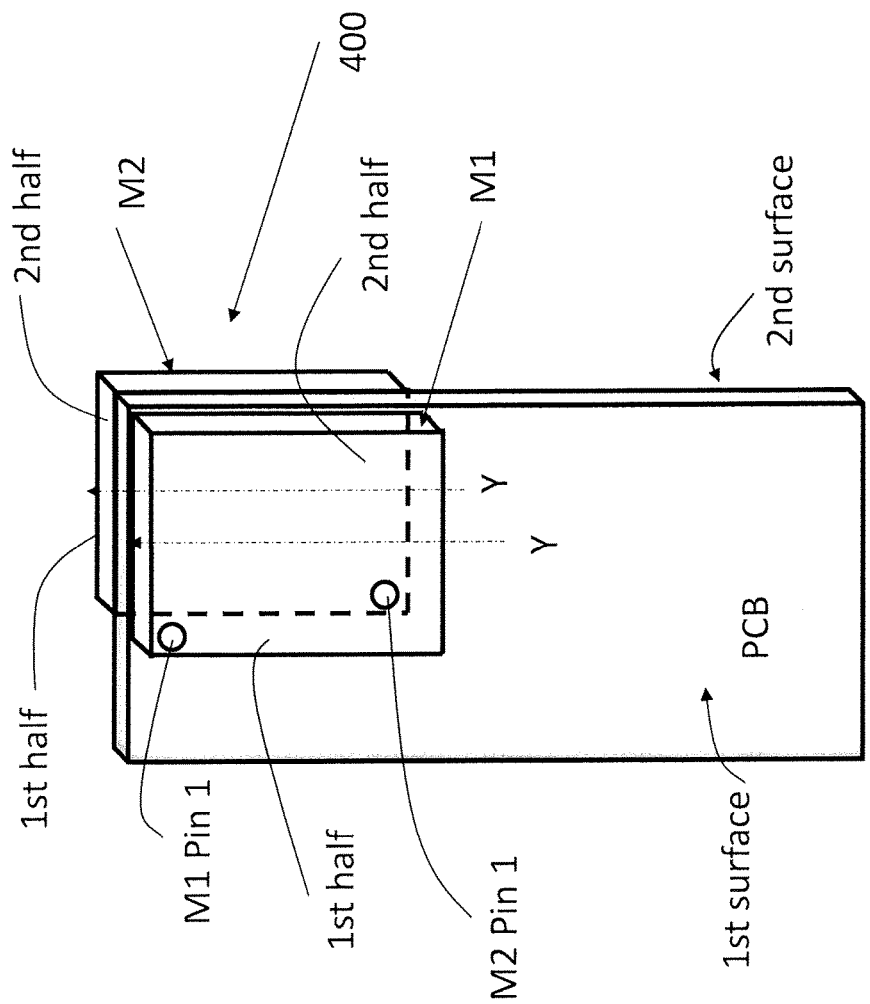
FIG. 4 is a perspective schematic view illustrating a memory arrangement according to embodiments herein.

FIG. 4 shows a memory arrangement 400 according embodiments herein. As shown in FIG. 4, the memory arrangement 400 comprises at least two memory chips M1, M2 arranged on a PCB. A first memory chip M1 is arranged on a first surface of the PCB, a second memory chip M2 is arranged on a second surface of the PCB. The second memory chip M2 is placed back to back to the first memory chip M1 and oriented such that respective pins having same function on the first memory chip M1 and the second memory chip M2 are placed opposite to each other. For example, command pin CMD, address pin ADDR, data pin DATA, clock pin CLK, power pin VCC, ground pin GND etc., as shown in FIG. 3, on the first memory chip M1 are opposite to command pin CMD, address pin ADDR, data pin DATA, clock pin CLK, power pin VCC, ground pin GND etc. on the second memory chip M2. Since pairs of pins that have the same functions on the first and second memory chips are placed opposite to each other, each pair can be connected together by via and then connected to respective signal traces, such as command line, address line, data bus, clock bus, power supply plane, ground plane etc. arranged between the first and second surfaces of the PCB.

Similar to the embodiments discussed in connection with FIG. 3, FIG. 4 illustrates embodiments where the second memory chip M2 is rotated 180° around its center such that the first half of the first memory chip M1, will be placed opposite to the first half of the second memory chip M2, and the second half of the first memory chip M1 will be opposite to the second half of the second memory M2. Here, the first half and second half of each memory chip M1, M2 are referred to as the two halves divided along the Y-axis. The skilled person will understand that this may apply equally to the two halves divided along the X-axis, depending on the construction of the memory chips. In other words, for example, looking from the top of the chips M1, M2, using the denotation of FIG. 3, the upper left pin Pin 1 of M1 will be placed opposite to the lower left pin Pin 14 of M2, and the upper left pin Pin 1 of M2 will be placed opposite to the lower left pin Pin 14 of M1. Although these two pins are at different places on the memory chip, they serve the same electrical function, e.g. both are ground pins.

Therefore, the embodiment herein is based on an idea of creating one virtual memory package derived from two physical memory packages. This is done by seeing a memory chip as one symmetric memory chip with two halves, and putting two such memory chips, one on each side of the PCB, such that one half of each memory chip together form one memory unit. In this way, the second memory chip M2 can be seen as mirror symmetric to the first memory chip M1.

Figure 5:
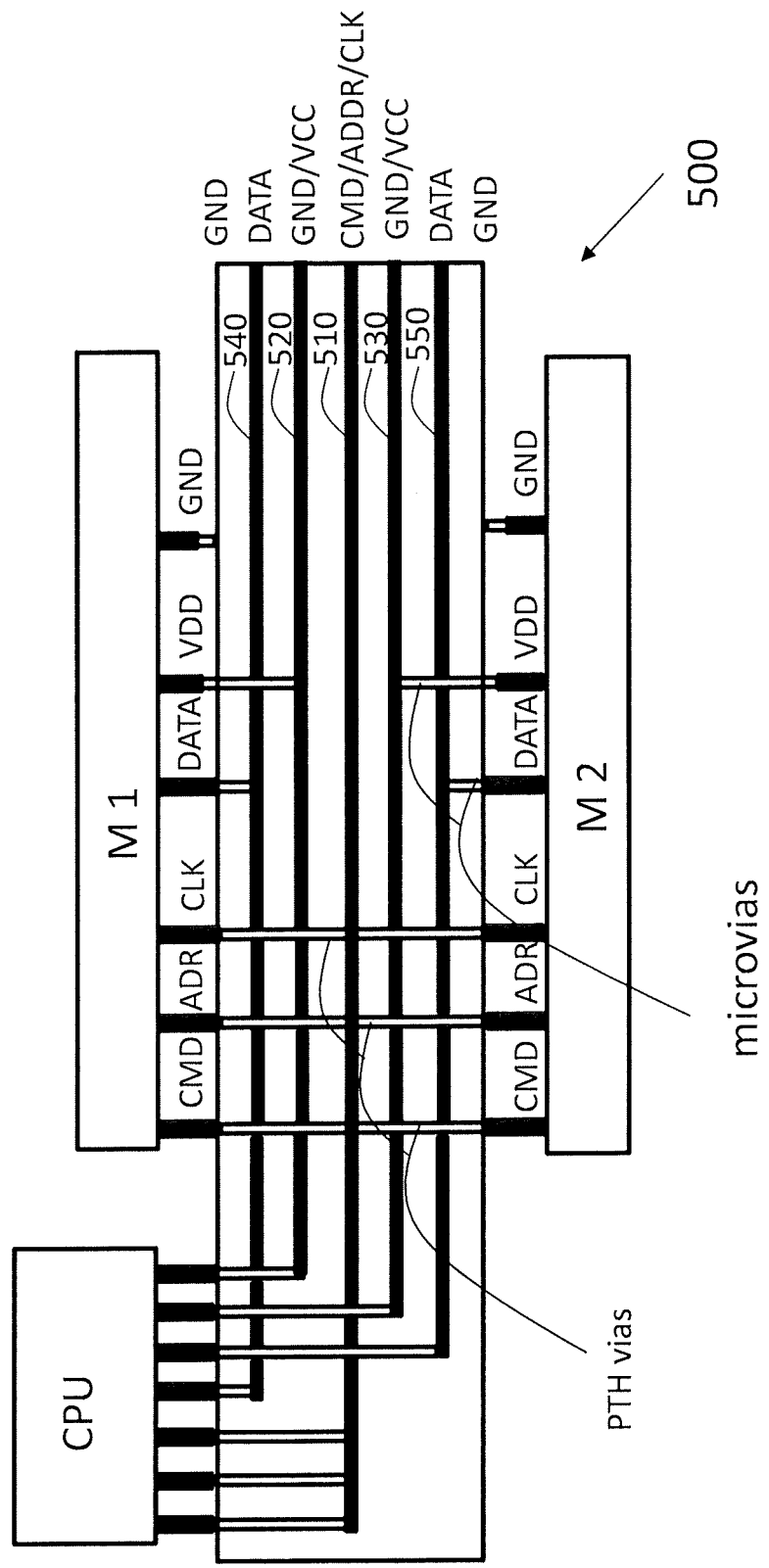
FIG. 5 is a side cut schematic view illustrating an example distribution of connecting layers on a PCB for connecting a memory arrangement to a CPU according to embodiments herein.

As a result of the symmetry and being placed back to back on the two surfaces of the PCB, the prior art use of T-branches for connecting two memory chips are reduced to just the length of vias. FIG. 5 shows an example of distributing signal traces on the different layers of the PCB.

According to some embodiments, respective pins having functions such as address ADDR, command CMD and clock CLK on the first and the second memory chips M1, M2, may be connected by Plated Through, PTH, Vias, to respective signal traces, such as command line, address line, clock bus, arranged on a center layer 510 of the PCB. As these signal traces are timing critical and sensitive to disturbance, by putting them on the center layer, they will have the same distance to M1 and M2. In this way, the same signal transmission length and symmetry are guaranteed for M1 and M2. As shown in FIG. 5, the PTH vias go straight through all layers of the PCB.

According to some embodiments, power supply pins VCC on the first and the second memory chips M1, M2 may be connected by PTH vias to a power supply plane arranged on a first layer 520 above the center layer 510 of the PCB. Notice here, the power supply plane may also be placed on a layer under the center layer of the PCB. Therefore, depending on the physical orientation of the PCB, the term "above/under" used here and hereafter should be considered to be non-limiting.

According to some embodiments, ground pins GND on the first and second memory chips M1, M2 may be connected by PTH vias to a ground plane arranged on a second layer 530 under the center layer of the PCB.

Typically, there is also a printed or plated metal layer or metal traces on the top and bottom surface of the PCB serving as a ground plane for components placed on each side of the PCB, as shown in FIG. 5.

According to some embodiments, pins having DATA function on the first memory chip M1 may be connected by microvias to at least one data bus arranged on a third layer 540 above the center layer of the PCB. Microvias are blind or buried vias, that usually go through one or more layers at one place, and then if needed, go through another one or more layers at another place for a connecting trace to avoid intersecting with other connections.

According to some embodiments, pins having DATA function on the second memory chip M2 may be connected by microvias to at least one data bus arranged on a fourth layer 550 under the center layer of the PCB.

According to some embodiments, if one memory chip is needed for one CPU, and another memory chip is needed for another CPU or another unit, the first half of the first memory chip M1 and the first half of the second memory chip M2 may be combined as a first virtual physical memory unit for connecting to a first Central Processing Unit, CPU. A second half of the first memory chip M1 and a second half of the second memory chip M2 may be combined as a second virtual physical memory unit for connecting to a second CPU or another unit.

According to some embodiments, when a CPU has two memory interfaces, the first half of the first memory chip and a first half of the second memory chip may be combined as a first virtual physical memory unit for connecting to a first memory interface of the CPU, and a second half of the first memory chip and a second half of the second memory chip may be combined as a second virtual physical memory unit for connecting to a second memory interface of the CPU.

According to some embodiments, the first memory chip M1 and the second memory chip M2 may be combined as one virtual physical memory unit for connecting to a CPU. In this way, for example, a 32 bits memory can be extended to a 64 bits memory and be connected to the CPU.

Figure 6:
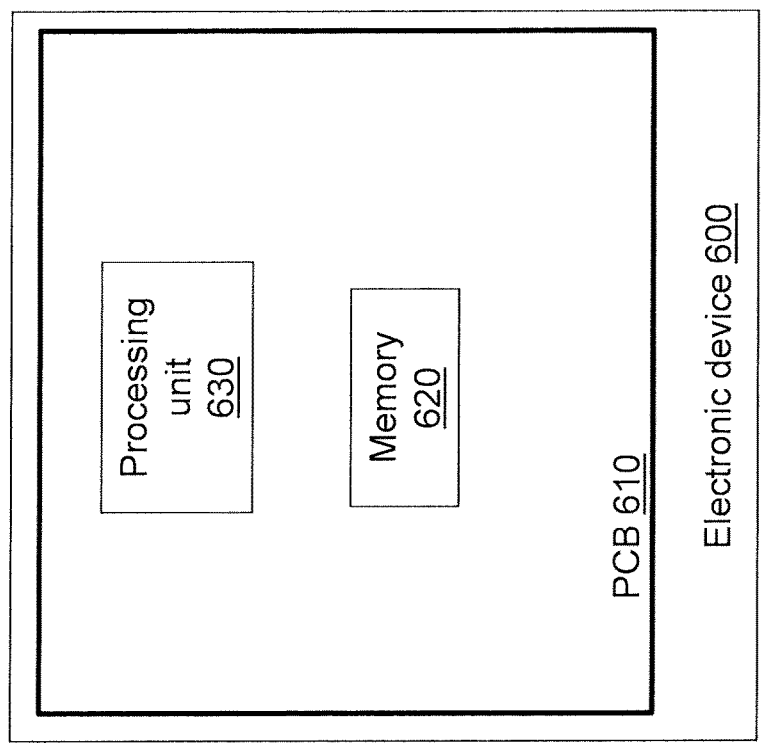
FIG. 6 is a block diagram illustrating an electronic device in which a memory arrangement according to embodiments herein may be implemented.

The memory arrangement 400, 500 according to embodiments herein is suitable for any electronic device which needs memory. FIG. 6 shows an electronic device 600 in which the memory arrangement 400, 500 according to embodiments herein may be implemented. The electronic device 600 may be any one of a computer, a laptop, a tablet, a wireless communication device, a wireless data acquisition device, a camera, such as a monitoring camera, a network video recorder, a home automation device, a data logger, a video encoder, a physical access controller, a door station, etc. The electronic device 600 comprises a PCB 610 comprising a memory arrangement 620 according to embodiments herein. The electronic device 600 may comprise other units, e.g., a processing unit 630 for communicating with the memory arrangement 620 and signal processing etc.

Figure 7:
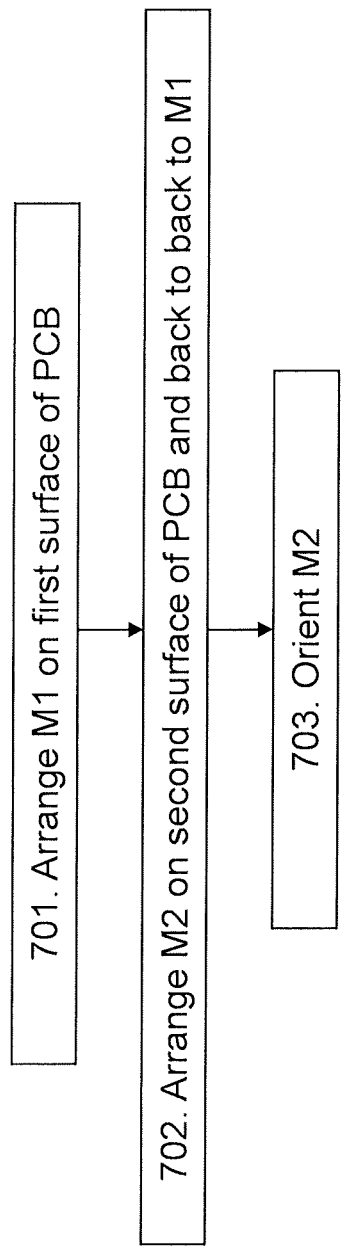
FIG. 7 is a flow chart illustrating a method to arrange memory chips on a PCB.

Corresponding method for arranging memory chips on the PCB will be described with reference to FIG. 7. The method comprises the following actions:

Action 701: Arranging a first memory chip M1 on a first surface of the PCB.

Action 702: Arranging a second memory chip M2 on a second surface of the PCB back to back to the first memory chip.

Action 703: Orienting the second memory chip M2 such that respective pins having same function on the first and the second memory chips are placed opposite to each other and connected by vias to respective signal traces arranged between the first and second surfaces of the PCB.

To summarise, some advantages of the memory arrangement 400, 500 according to embodiments herein include:

First, since two memory chips are placed back to back on the two surfaces of the PCB and corresponding pins on the first and second memory chip are placed opposite to each other, the prior art use of T-branches for connecting two memory chips to the CPU can instead be formed as vias. The signal traces are therefore symmetrical and much shorter than prior art solutions. As a result, the transmission line effect is reduced and the signal speed can be increased.

Second, since T-branches are eliminated, the layout topology is less complex and the area requirement on the PCB is smaller. The footprint may be reduced by 30-40%. This will reduce the manufacturing cost.

Further, the arrangement of the memory chips one on each side of the PCB improves the thermal characteristics, as heat may thereby dissipate in two directions.

Additionally, the power distribution may be improved.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A memory arrangement comprising a Printed Circuit Board, PCB, and at least two memory chips arranged on the PCB, wherein
   a first memory chip is arranged on a first surface of the PCB;
   a second memory chip is arranged on a second surface of the PCB; and wherein
   each memory chip is symmetrical about a center axis such that a first half and second half of each memory chip divided by the center axis are mirror symmetric to each other with regards to pins function; and
   the second memory chip is placed back to back to the first memory chip such that respective pins having the same function on the first memory chip and the second memory chip are placed opposite to each other; and
   respective pins having any of the functions address, command and clock on the first and the second memory chips are connected by Plated Through, PTH, vias, to respective signal traces arranged on a center layer of the PCB.

2. The memory arrangement according to claim 1, wherein a first half of the first memory chip and a first half of the second memory chip are combined as a first virtual physical memory unit for connecting to a first Central Processing Unit, CPU.

3. The memory arrangement according to claim 1, wherein a second half of the first memory chip and a second half of the second memory chip are combined as a second virtual physical memory unit for connecting to a second CPU.

4. The memory arrangement according to claim 1, wherein a first half of the first memory chip and a first half of the second memory chip are combined as a first virtual physical memory unit for connecting to a first memory interface of a CPU, and a second half of the first memory chip and a second half of the second memory chip are combined as a second virtual physical memory unit for connecting to a second memory interface of the CPU.

5. The memory arrangement according to claim 1, wherein the first memory chip and the second memory chip are combined as one virtual physical memory unit for connecting to a CPU.

6. The memory arrangement according to claim 1, wherein power supply pins on the first and the second memory chips are connected by PTH vias to a power supply plane arranged on a first layer above the center layer of the PCB.

7. The memory arrangement according to claim 1, wherein ground pins on the first and second memory chips are connected by PTH vias to a ground plane arranged on a second layer under the center layer of the PCB.

8. The memory arrangement according claim 1, wherein pins having DATA function on the first memory chip are connected by microvias to at least one data bus arranged on a third layer above the center layer of the PCB.

9. The memory arrangement according claim 1, wherein pins having DATA function on the second memory chip are connected by microvias to at least one data bus arranged on a fourth layer under the center layer of the PCB.

10. An electronic device comprising a memory arrangement according to claim 1.

11. The electronic device according to claim 10 comprising any one of a computer, a laptop, a tablet, a wireless communication device, a wireless data acquisition device, a camera, such as a monitoring camera, a network video recorder, a home automation device, a data logger, a video encoder, a physical access controller or a door station.

\* \* \* \* \*